United States Patent
Iijima et al.

(10) Patent No.: US 10,063,004 B2
(45) Date of Patent: Aug. 28, 2018

(54) CONTROLLER ASSEMBLY

(71) Applicant: SMC Corporation, Chiyoda-ku (JP)

(72) Inventors: Eiji Iijima, Moriya (JP); Atsushi Fujiwara, Moriya (JP); Takeshi Hirose, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/426,505

(22) Filed: Feb. 7, 2017

(65) Prior Publication Data

US 2017/0250493 A1 Aug. 31, 2017

(30) Foreign Application Priority Data

Feb. 29, 2016 (JP) .................. 2016-036546

(51) Int. Cl.
- *H01R 9/26* (2006.01)
- *H01R 13/514* (2006.01)
- *H01R 13/52* (2006.01)
- *H01R 25/14* (2006.01)

(52) U.S. Cl.
CPC ....... *H01R 13/514* (2013.01); *H01R 13/5202* (2013.01); *H01R 25/142* (2013.01)

(58) Field of Classification Search
CPC ...... H01R 9/26; H01R 9/2675; H01R 9/2408; H01R 27/00; H01R 103/00

USPC ..... 439/716, 218, 715, 717, 222; 307/43, 32
See application file for complete search history.

(56) References Cited

U.S. PATENT DOCUMENTS

| | | | | |
|---|---|---|---|---|
| 6,418,027 B1 * | 7/2002 | Suzuki | ................... | G06F 1/183 361/679.02 |
| 7,480,147 B2 * | 1/2009 | Hoss | ........................ | G06F 1/20 361/715 |

FOREIGN PATENT DOCUMENTS

JP 2007-175856 7/2007

* cited by examiner

*Primary Examiner* — Phuong Chi T Nguyen
(74) *Attorney, Agent, or Firm* — Oblon, McClelland, Maier & Neustadt, L.L.P.

(57) ABSTRACT

A controller assembly includes a plurality of controller units, and a heat dissipating unit interposed between the controller units. Male and female connectors are disposed in the controller units, and the connectors thereof are fitted to female and male connectors of the heat dissipating unit to thereby establish electrical contact therebetween. Upon driving electric actuators, heat generated in circuit boards of the controller units is dissipated to the exterior through a plurality of heat dissipating protrusions provided on the heat dissipating unit, so that heat generating sources of the circuit boards are cooled.

8 Claims, 7 Drawing Sheets

CONTROLLER ASSEMBLY

CROSS-REFERENCE TO RELATED APPLICATION

This application is based upon and claims the benefit of priority from Japanese Patent Application No. 2016-036546 filed on Feb. 29, 2016, the contents of which are incorporated herein by reference.

BACKGROUND OF THE INVENTION

Field of the Invention

The present invention relates to a controller, and more specifically, relates to a controller assembly, which enables a plurality of controllers to be arranged in a stacked condition, together with suitably releasing heat generated by loads connected to the controllers.

Description of the Related Art

Conventionally, a controller has been used as a robot control device to supply necessary electric power with respect to actuators for the purpose of extending and rotating an arm of the robot, as well as to transmit control signals for performing various operations. In Japanese Laid-Open Patent Publication No. 2007-175856, a robot controller has been proposed that expands the freedom in installation and placement of the robot without adversely affecting cooling efficiency concerning generation of heat due to operations of the robot. More specifically, a configuration is shown in which heat dissipating fins are arranged in close proximity to a circuit board that makes up a motor driver for driving a robot.

SUMMARY OF THE INVENTION

The motor driver that is used in the robot controller of Japanese Laid-Open Patent Publication No. 2007-175856 is accommodated in the interior of a comparatively large scale main body housing made up from a pair of right and left side plates, a top plate, and a pair of front and rear side plates. Further, from the content depicted in FIG. 1 of the patent document, it can be understood that the structure thereof is applicable to a single main controller. Consequently, there is no possibility for a main controller of this type to originate an idea of controlling a plurality of identical actuators within a limited space, and further, it is difficult to respond to demands for miniaturization.

Moreover, the installation location for a small scale controller may not be the site where work actually is performed, and in many cases, such a small scale controller is installed in a power distribution board in which the electrical wiring therefor is centrally controlled. However, such a power distribution board does not have enough space for installation of the controller, even though the controller is small in scale, and even if the controller can be installed therein, it is difficult to add or change subsequent controllers.

On the other hand, if the distance from the power distribution board to the actuators is long, not only is it difficult to arrange cables for supply of power for driving and transmission of control signals, but there also is a disadvantage in that losses occur during the supply of power. In order to avoid such an inconvenience, there has been a demand for a controller which can be disposed in the vicinity of a work site, without requiring the controller to be installed in a power distribution board.

However, at the work site, a situation generally exists in which coolant liquids, dust, and the like are scattered about and undergo convection. Thus, a new demand has arisen, which requires the controller itself to be provided with a dust-proof and drip-proof structure. However, with a controller for supplying a large current in order to drive the actuators, since a large amount of heat is generated from the electronic components provided in the interior thereof, countermeasures must be taken separately in response to such generation of heat.

For this reason, for example, if it is attempted to install a plurality of individual controllers within a limited space, it is necessary to consider anew such features as limitations on the installation interval, heat dissipating fans, ventilation openings, etc., and in actuality, it is difficult to achieve a compact size for such a controller and a saving in space.

The present invention has been devised in order to solve at once problems of this type, and has the object of providing a controller assembly in which a plurality of individual controllers can be arranged in close proximity, and, by suitably releasing, to the exterior, heat that is generated from each of the controllers, cooling efficiency is increased, and the controller assembly can be made economical in terms of space and small in scale.

In order to solve these problems, the present invention is characterized by a controller assembly including a plurality of controller units connected respectively to actuators, and a heat dissipating unit interposed between the controller units, wherein the heat dissipating unit includes a plurality of heat dissipating protrusions configured to dissipate heat that is generated by heat generating sources of the controller units, to the exterior.

In accordance with this configuration, since the heat dissipating units are provided with the plurality of heat dissipating protrusions, which provide a widened heat dissipating area, it is possible to effectively dissipate, to the exterior, heat that is generated in each of the controller units, while in addition, since the controller units and the heat dissipating units are directly connected continuously to each other, useless space between both the controller units and the heat dissipating units is eliminated, and saving in space is achieved.

In the controller assembly of the present invention, the heat dissipating unit may include connectors configured to be connected electrically to respective connectors of the controller units.

In accordance with this configuration, since connectors for electrical connection with the connectors of the controller units are provided on the heat dissipating units, there is no need to consider the arrangement of external wiring, and an advantage is achieved in that bonding between the heat dissipating units and the controller units is strong and durable while the connection looks good and simple in appearance.

In the controller assembly of the present invention, the heat dissipating unit may be attachable and detachable with respect to the controller units.

In accordance with this configuration, since the heat dissipating units are engaged in a detachable manner with each of the controller units, without being limited in the number of the controller units and heat dissipating units that are connected together continuously, maintenance operations thereon are facilitated.

In the controller assembly of the present invention, each of the controller units and the heat dissipating unit has a rectangular parallelepiped shape, a fitting projection is provided on one surface of each of the controller units and the heat dissipating unit, while a fitting recess is provided on another surface thereof, and the controller units and the heat dissipating unit are connected together continuously by the fitting projection of each of the controller units being fitted into the fitting recess of the heat dissipating unit, and the fitting projection of the heat dissipating unit being fitted into the fitting recess of the controller units.

In accordance with this structure, since the controller units and the heat dissipating units are connected together continuously by male and female engagement of the fitting projections and the fitting recesses, assembly and disassembly is facilitated since both units can easily be engaged and disengaged with each other, while in addition, at the time that a malfunction is found in a specific controller unit connected continuously to the controller units, an operation can easily be performed to remove and verify only that particular controller unit.

In the controller assembly of the present invention, a dust-proof or drip-proof sealing member may be provided around the periphery of the fitting projection of each of the controller units and the heat dissipating unit.

In accordance with this configuration, it is possible to avoid a situation in which fine dust or water droplets that occur in a factory or the like become adhered to circuit boards of the controller units and cause a malfunction therein.

In the controller assembly of the present invention, openings through which the connectors are exposed may be disposed respectively on inner sides of the fitting projection and the fitting recess of each of the controller units and the heat dissipating unit.

In accordance with this configuration, since the openings are provided on inner sides of the fitting projections and the fitting recesses for thereby continuously connecting the controller units and the heat dissipating units, and the connectors are provided in facing relation to such openings, an advantage is realized in that the structure can be simplified and reduced in scale, without providing a special installation site for the connectors.

In the controller assembly of the present invention, one surface of each of the controller units may include a heat dissipating plate, and another surface of the heat dissipating unit may be placed in contact with the heat dissipating plate.

In accordance with this configuration, due to the fact that the heat dissipating plate, which constitutes one side surface of the controller unit, is disposed in proximity to a circuit board serving as a heat generating source, and the other surface of the heat dissipating unit is placed in direct contact with the heat dissipating plate, the generated heat can be dissipated more effectively and such heat can be transferred to the heat dissipating unit.

In the controller assembly of the present invention, a heat dissipating sheet may be provided on the other surface of the heat dissipating unit, and the heat dissipating sheet may be placed in contact with the heat dissipating plate.

In accordance with this configuration, the side plate of the controller unit is constituted by the heat dissipating plate, and further, the heat dissipating sheet provided on the heat dissipating unit is arranged by being pressed against the heat dissipating plate. Therefore, dissipation of heat generated in the controller units can be more effectively achieved.

In the controller assembly of the present invention, a recessed portion may be provided on the other surface of the heat dissipating unit, and the heat dissipating sheet may be disposed in the recessed portion.

In accordance with this configuration, since the heat dissipating sheet is disposed in the recessed portion, the thickness of the heat dissipating sheet does not present an obstacle to continuously connecting the heat dissipating units and the controller units.

According to the present invention, a plurality of controller units can be arranged in close proximity, and together therewith, by suitably releasing, to the exterior, heat generated in each of the controller units by the heat dissipating units disposed in contact with the controller units, cooling efficiency in relation to the controller units can be increased, and it is possible to obtain a controller assembly that is economical in terms of space and small in scale.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

A preferred embodiment of a controller assembly according to the present invention will be presented and described in detailed below with reference to the accompanying drawings.

Figure 1:
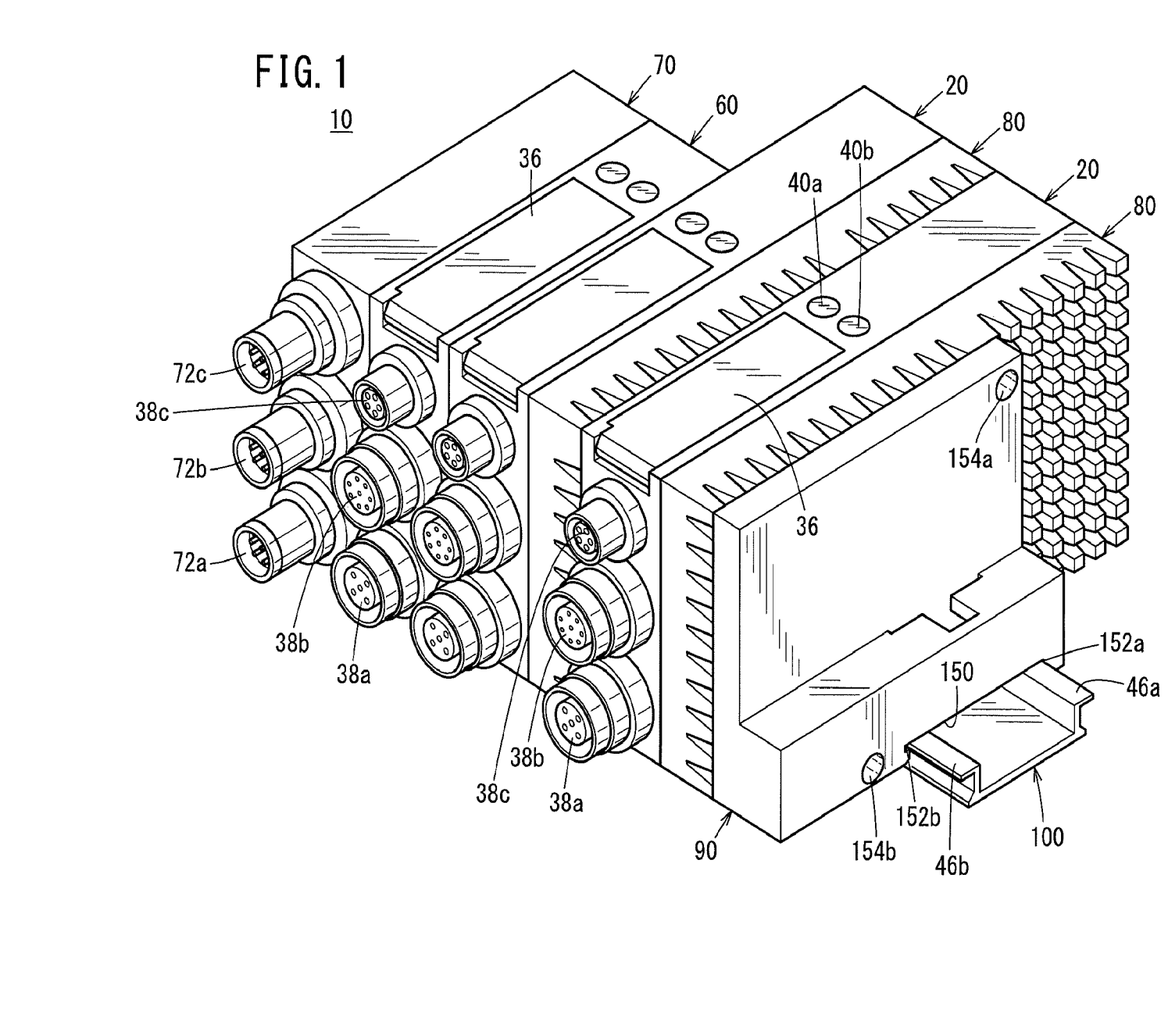
FIG. 1 is a perspective view showing a condition of use of a controller assembly according to the present invention.
Figure 2:
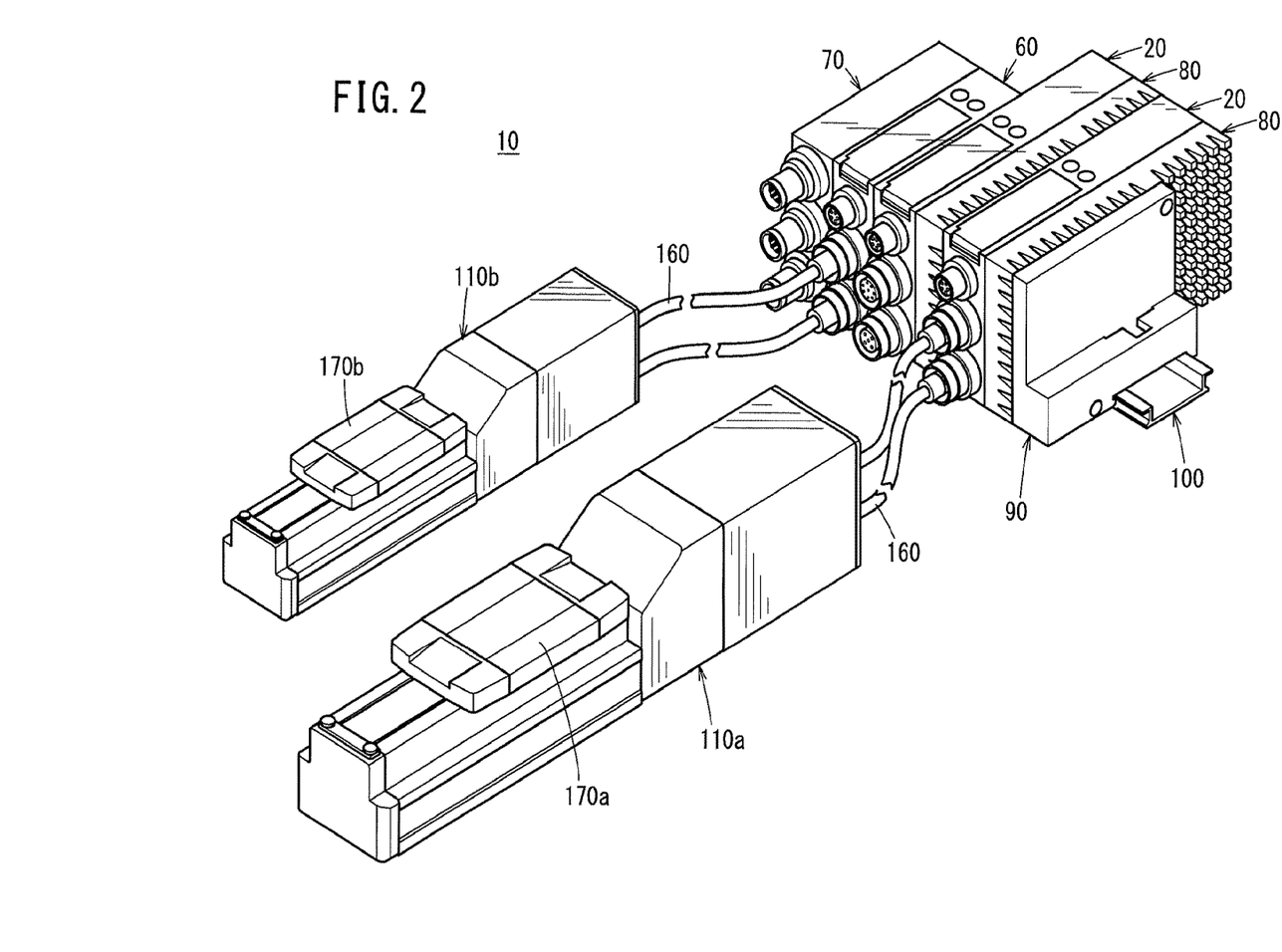
FIG. 2 is a perspective view showing a connection relationship between the controller assembly and an electric actuator.

FIG. 1 is a perspective view showing a condition of use of a controller assembly according to the present embodiment, and FIG. 2 is a perspective view showing a state where the controller assembly according to the present embodiment is connected to an electric actuator.

The controller assembly 10 according to the present embodiment basically is constituted by first controller units 20, a second controller unit 60 that is shorter in a longitudinal direction than the first controller units 20, an input unit 70 mounted on a side surface of the second controller unit 60, heat dissipating units 80 joined to the first controller units 20, and an end block 90 that is pressed against one of the heat dissipating units 80 from an outer side of the controller assembly to thereby tighten the first controller units 20, the second controller unit 60, the heat dissipating units 80, and the input unit 70 together by non-illustrated tie rods. As can be understood easily from FIG. 1, the controller assembly 10 is installed in a desired location by a rail 100.

FIG. 2 is a perspective view showing a connected state where electric actuators 110a, 110b are connected with the controller assembly 10. Power and control signals are transmitted to the actuators from the first controller units 20 and the second controller unit 60, whereby non-illustrated motors of the electric actuators 110a, 110b are driven, so that tables 170a, 170b are advanced or retracted through ball screws.

The various constituent elements of the controller assembly 10, which is constructed in the foregoing manner, will be described in detail below.

Figure 3:
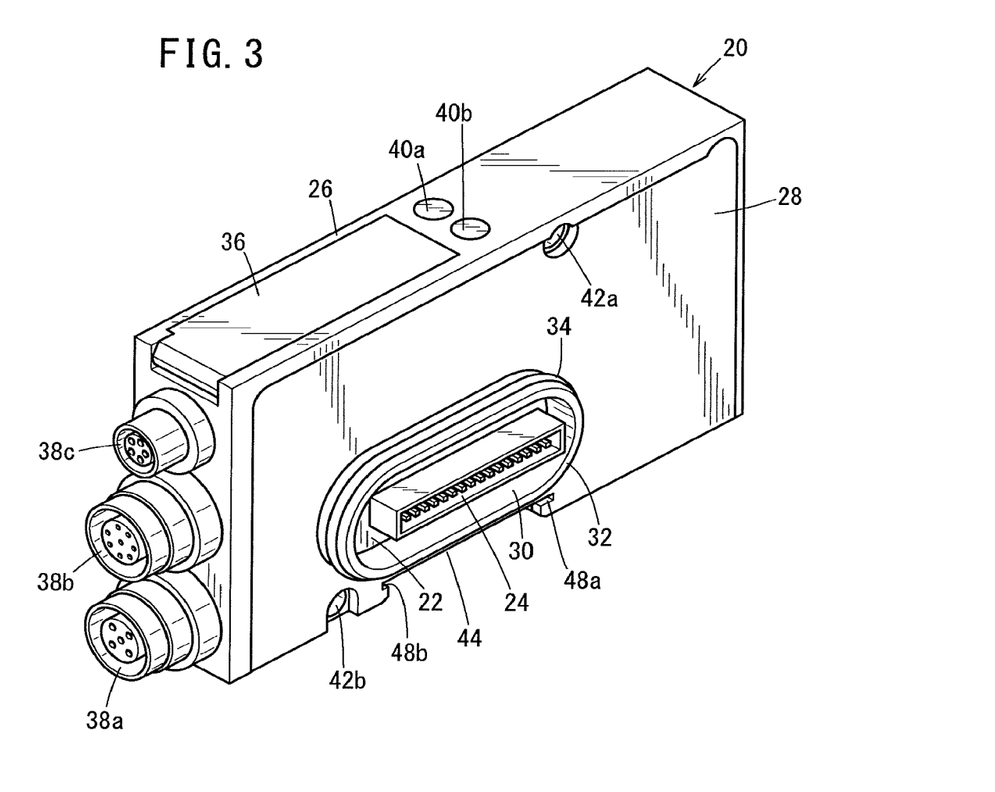
FIG. 3 is a perspective view showing a first controller unit that constitutes part of the controller assembly.

FIG. 3 is a perspective view showing a first controller unit 20 that constitutes part of the controller assembly 10. The first controller unit 20 has an elongated rectangular parallelepiped shape, and the first controller unit 20 contains therein a circuit board 22 on which electric circuit components are mounted for controlling operation of the electric actuators 110a and 110b. A first connector 24 is provided on the circuit board 22 in order to establish electrical connection with another first controller unit 20. A portion of the circuit board 22 and the first connector 24 are exposed to the exterior from a heat dissipating plate 28 that constitutes part of a rectangular parallelepiped shaped housing 26 of the first controller unit 20. More specifically, the heat dissipating plate 28 is made of a member that is excellent in terms of thermal conductivity, and has an elliptical opening 30 located below a central portion thereof. In addition, an elliptical shaped fitting projection 32 is provided in surrounding relation to the opening 30. The first connector 24 is exposed to the exterior through the opening 30. An elliptical shaped annular groove is disposed around the fitting projection 32, and an o-ring 34 (sealing member) is fitted in the groove.

As will be discussed later, the o-ring 34 serves to ensure a dust-proof and drip-proof state when the first controller unit 20 is joined to another first controller unit 20 or to the second controller unit 60, and further, when the first controller unit 20 is joined to the heat dissipating unit 80. More specifically, although the circuit board 22 is exposed to the exterior through the opening 30, by the fitting projection 32, when the first controller unit 20 is joined by the o-ring 34 with another controller unit or with a heat dissipating unit, introduction of dust and water vapor, which results in electrical damage to the circuit board 22, is avoided.

A cover 36 is disposed on an upper portion of the housing 26 and is capable of being opened and closed freely. By opening the cover 36, it is possible to perform settings for a non-illustrated rotary switch or the like, and a switch group, not shown, which are attached to the circuit board 22. A drive power source terminal 38a for supplying power to the electric actuators 110a and 110b shown in FIG. 2, a position information input terminal 38b for inputting output signals of sensors that detect the direction of movement and the movement distance of the tables 170a and 170b that make up the electric actuators 110a and 110b, and a contact input terminal 38c for inputting the outputs of auto switches or the like that are mounted on the electric actuators 110a and 110b are provided on one narrow side surface of the housing 26.

In FIG. 3, reference numerals 40a and 40b indicate light emitting elements for enabling visual confirmation of the operating states of the first controller unit 20 from the exterior, and reference numerals 42a and 42b indicate penetrating holes through which non-illustrated tie rods are inserted in order to integrate as a unitary structure the controller assembly 10 shown in FIG. 1.

In this case, a rail insertion recess 44 through which the rail 100 is inserted is provided below the fitting projection 32 of the housing 26 that makes up the first controller unit 20, and grooves 48a, 48b into which flanges 46a, 46b of the rail 100 are fitted are provided at both end portions of the rail insertion recess 44.

Figure 4:
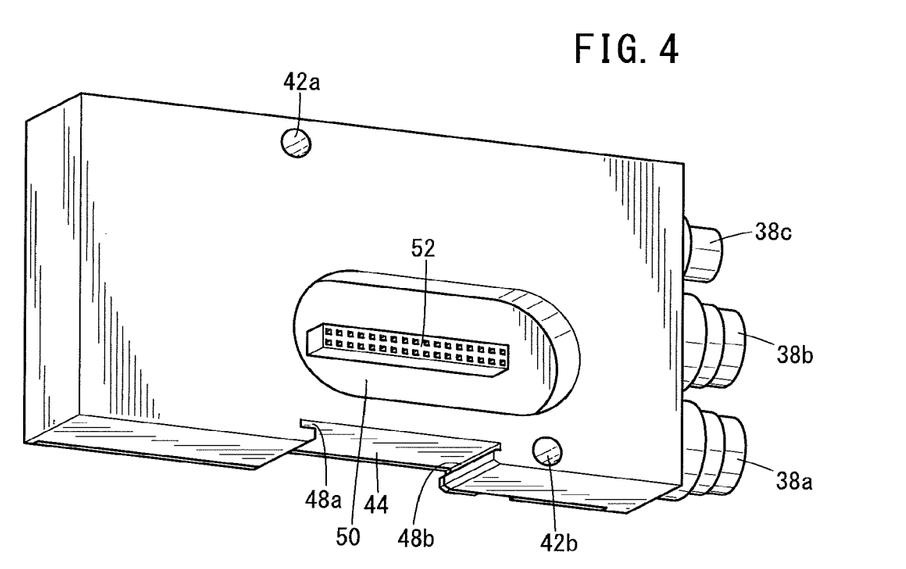
FIG. 4 is a perspective view showing a condition in which the first controller unit is viewed from a side opposite to the direction depicted in FIG. 3.

As shown in FIG. 4, on an opposite side from the heat dissipating plate 28 in the first controller unit 20, an elliptical shaped fitting recess 50, which is of the same size as the fitting projection 32, is formed at a position corresponding to the opening 30 provided in the heat dissipating plate 28, together with providing a second connector 52 which is positioned on an opposite side from the first connector 24. More specifically, the fitting recess 50 serves as an opening corresponding to the opening 30, and as with the first connector 24, the second connector 52 is exposed to the exterior through the opening, which is the inner side of the fitting recess 50. In the embodiment, assuming that the first connector 24 is a male connector, the second connector 52 functions as a female connector, and at a time that the first connector 24 is joined to another first controller unit 20, an electrical connection is established by fitting with the female type second connector 52.

The second controller unit 60 basically is made up from the same constituent elements as the first controller unit 20, but differs therefrom in that the length in the longitudinal direction of the second controller unit 60 is shorter than that of the first controller unit 20. Accordingly, the same reference characters are used to designate the same constituent elements, and detailed description of such features is omitted.

As shown in FIG. 1, the input unit 70 is connected to the second controller unit 60. Power supply terminals 72a to 72c for inputting power are disposed in the input unit 70. The input unit 70 belongs to the conventional art, and therefore, a detailed description of the input unit 70 will be omitted herein.

Next, a description will be given of the heat dissipating unit 80, which is disposed in the controller assembly 10 so as to be in close contact with the first controller unit 20.

Figure 5:
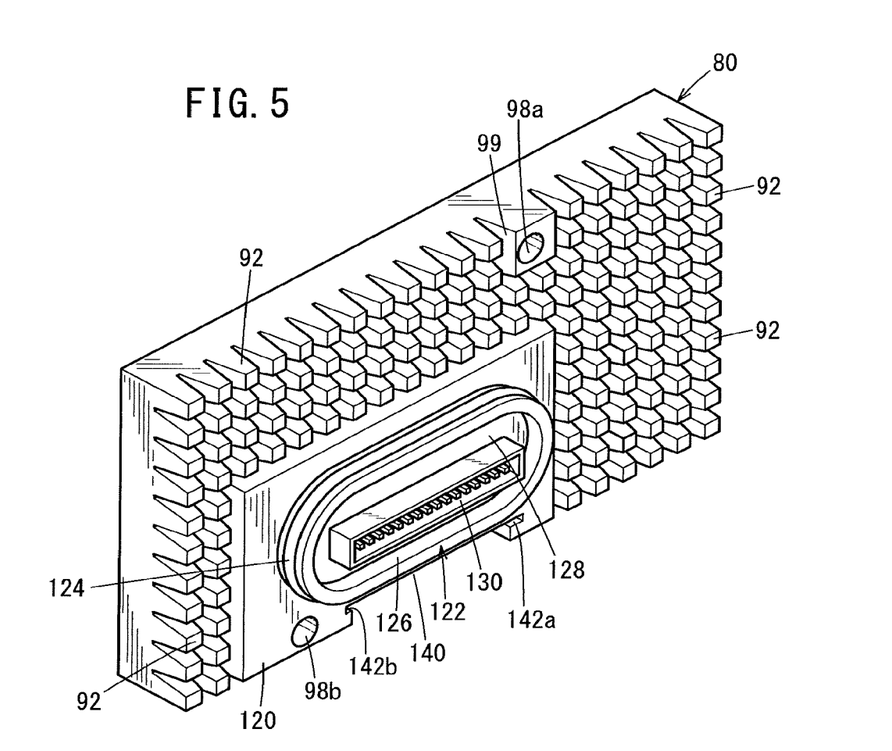
FIG. 5 is a perspective view showing a heat dissipating unit that is used in the controller assembly.

As shown in FIG. 5, the heat dissipating unit 80 is made up from a rectangular parallelepiped body having substantially the same length in the horizontal direction and the vertical direction, although having a different thickness than that of the first controller unit 20. Preferably, the heat dissipating unit 80 is formed integrally from a material that is excellent in terms of the heat dissipating properties thereof, for example, a metal material such as aluminum or copper, a resin material, etc. On one surface of the heat dissipating unit 80, a large number of heat dissipating protrusions 92 having trapezoidal shapes in cross section are disposed continuously in alignment along lines in a horizontal direction and a vertical direction thereof. In the heat dissipating protrusions 92, first heat dissipating grooves 94 are formed vertically between respective adjacent heat dissipating projections 92, and second heat dissipating grooves 96 are further provided which extend in a horizontal direction (see FIG. 7). Moreover, in order to provide a penetrating hole 98a corresponding to the penetrating hole 42a of the first controller unit 20, a projection 99 is provided, which has the same height as that of the heat dissipating protrusions 92, but is greater in length in the horizontal and vertical directions than the heat dissipating protrusions 92.

A rectangular connecting section 120 is provided on a side of the heat dissipating unit 80 where the heat dissipating protrusions 92 are disposed. Although the connecting section 120 may be formed integrally with the heat dissipating protrusions 92, alternatively the connecting section 120 may be formed separately from the heat dissipating protrusions 92. In that case, a space in which the connecting section 120 is fitted is provided in the heat dissipating unit 80, such that the connecting section 120 may be incorporated therein. The connecting section 120 is provided with a penetrating hole 98*b* therein that corresponds to the penetrating hole 42*b* of the first controller unit 20, together with a fitting projection 122 that corresponds to the fitting projection 32 of the first controller unit 20.

As with the case of the fitting projection 32, an o-ring 124 (sealing member) is fitted around the periphery of the fitting projection 122. A flat plate-shaped attachment section 128 is provided in an opening 126 located on an inner side of the fitting projection 122. A third connector 130, which corresponds to the first connector 24 of the first controller unit 20, is disposed on the attachment section 128. The first connector 24 and the third connector 130 have substantially the same structure, and therefore, detailed description of the third connector 130 is omitted.

Figure 6:
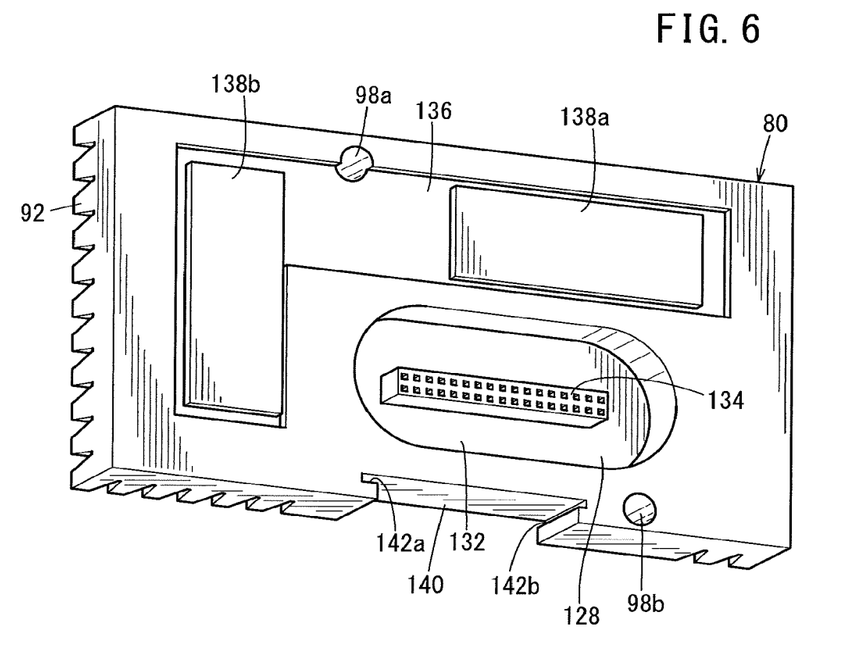
FIG. 6 is a perspective view showing a condition in which the heat dissipating unit is viewed from a side opposite to the direction depicted in FIG. 5.

FIG. 6 is a view showing a configuration of the heat dissipating unit 80 on a side opposite to that depicted in FIG. 5. A fitting recess 132 having a size corresponding to the fitting recess 50 of the first controller unit 20 is provided on a rear surface side of the heat dissipating unit 80. The inner side of the fitting recess 132 also serves as an opening corresponding to the opening 126 provided on an inner side of the fitting projection 122. A fourth connector 134 is exposed to the exterior by projecting outwardly from the flat plate-shaped attachment section 128, which is disposed on an inner side of the fitting recess 132. The fourth connector 134 has a size and shape that correspond to those of the second connector 52 that is located on the rear side of the first controller unit 20. A recessed portion 136 with a widely formed L-shape is disposed above the fitting recess 132 of the heat dissipating unit 80.

Figure 7:
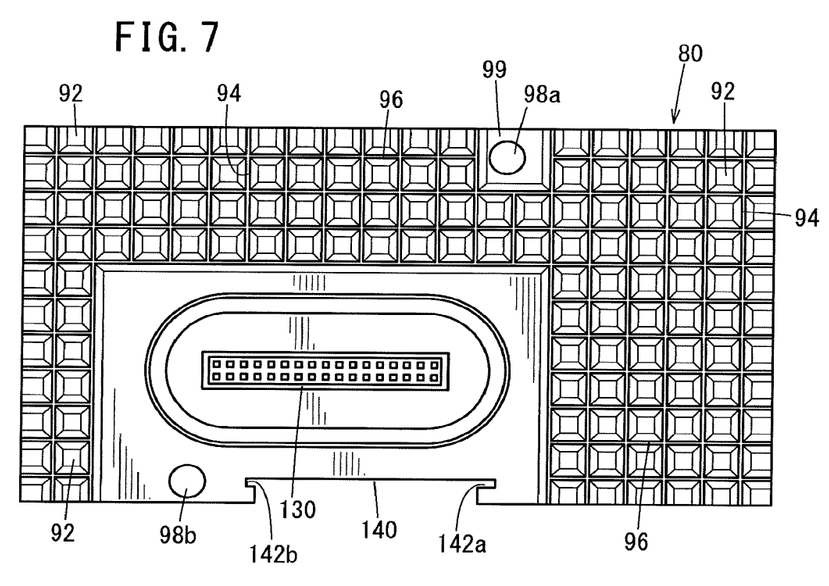
FIG. 7 is a front view of the heat dissipating unit illustrated in FIGS. 5 and 6.

Next, a first heat dissipating sheet 138*a* and a second heat dissipating sheet 138*b* are arranged in the recessed portion 136. The thicknesses of the first heat dissipating sheet 138*a* and the second heat dissipating sheet 138*b* are slightly greater than the depth of the recessed portion 136, and the heat dissipating sheets 138*a*, 138*b* exhibit excellent elasticity. The heat dissipating sheets 138*a*, 138*b* are made of a material having high thermal conductivity, and as shown in FIG. 1, when the heat dissipating unit 80 and the first controller unit 20 are combined, the heat dissipating sheets 138*a*, 138*b* are pressed against the heat dissipating plate 28, receive heat from the circuit board 22 that is transmitted through the heat dissipating plate 28, and transfer such heat to the side of the heat dissipating protrusions 92. Therefore, preferably, the first heat dissipating sheet 138*a* and the second heat dissipating sheet 138*b* are arranged so as to correspond to positions where heat is most likely to be generated on the circuit board 22 in the interior of the first controller unit 20. Alternatively, in the recessed portion 136, only one heat dissipating sheet may be disposed at a position where heat is most likely to be generated. The third connector 130 corresponds to the first connector 24 of the first controller unit 20, while the fourth connector 134 corresponds to the second connector 52, and the first connector 24 and the third connector 130 have a male/female relationship with the second connector 52 and the fourth connector 134. In FIGS. 5 to 7, reference numeral 140 indicates a recess corresponding to the rail insertion recess 44 of the first controller unit 20, whereas reference numerals 142*a* and 142*b* indicate grooves corresponding to the grooves 48*a* and 48*b* of the rail insertion recess 44.

Lastly, a description will be given concerning the end block 90. As can be understood from FIG. 1, the end block 90 is formed integrally from a metal material such as aluminum, a resin material, etc., having a thinner upper portion and a thicker lower portion, and is disposed on one side surface of the heat dissipating unit 80. In particular, by covering the connecting section 120 of the heat dissipating unit 80, the opening 126 thereof is closed. For this reason, although illustration thereof is omitted, preferably, a recess is provided having the same size as the opening 126 and into which the fitting projection 122 can be fitted. The end block 90 is provided with a rail insertion recess 150 for attachment to the rail 100, and together therewith, rail attachment grooves 152*a*, 152*b* into which the flanges 46*a*, 46*b* of the rail 100 can be fitted are provided at both end portions of the rail insertion recess 150 in a widthwise direction thereof. In the figure, reference numeral 154*a* indicates a penetrating hole that corresponds to the penetrating hole 98*a* of the heat dissipating unit 80, whereas reference numeral 154*b* indicates a penetrating hole that corresponds to the penetrating hole 98*b* of the heat dissipating unit 80.

The first controller units 20, the second controller unit 60, the input unit 70, and the heat dissipating units 80, which are constituted in the above manner, are assembled together in the following manner.

At first, using non-illustrated screws or the like, the rail 100 is fixed in a location where the controller assembly 10 is to be assembled, and thereafter, the input unit 70, the second controller unit 60, the first controller unit 20, the heat dissipating unit 80, the first controller unit 20, and the heat dissipating unit 80 are inserted onto the flanges 46*a*, 46*b* of the rail 100 in this order, and finally, the end block 90 is inserted and positioned on the rail 100.

Next, tie rods (not shown) are inserted through the penetrating holes 154*a*, 154*b* of the end block 90, the penetrating holes 98*a*, 98*b* of the heat dissipating units 80, the penetrating holes 42*a*, 42*b* of the first controller unit 20, non-illustrated penetrating holes of the second controller unit 60, and non-illustrated penetrating holes of the input unit 70, and by screw-engagement of nuts on the opposite side, the first controller units 20, the second controller unit 60, the heat dissipating units 80, the input unit 70, and the end block 90 are fastened together in an integral fashion.

In addition, ends of cables 160 are connected respectively to the drive power source terminal 38*a*, the position information input terminal 38*b*, and the contact input terminal 38*c* of the first controller unit 20, and to the drive power source terminal 38*a*, the position information input terminal 38*b*, and the contact input terminal 38*c* of the second controller unit 60, whereas the electric actuators 110*a*, 110*b* are connected to other ends of the cables 160. In this case, preferably, a relatively large scale electric actuator 110*a* is connected to the first controller unit 20, whereas a relatively small scale electric actuator 110*b* is connected to the second controller unit 60. Since the loads of the large scale electric actuator 110*a* and the small scale electric actuator 110*b* differ from each other, the amount of heat generated thereby also differs, and in accordance with such a difference in the amount of generated heat, a large scale heat dissipating unit is connected to the first controller unit 20. On the other hand, with respect to the second controller unit 60 which generates a relatively small amount of heat, a heat dissipating unit is not mounted thereon, but rather, the input unit 70 is connected thereto directly.

Upon completion of the preparatory steps described above, power is supplied to the power supply terminals 72*a* to 72*c* of the input unit 70, control signals are transmitted via the first controller units 20 and the second controller unit 60, and the electric actuators 110*a* and 110*b* are driven and controlled. More specifically, electrical power is supplied to the electric actuators 110*a* and 110*b* from the drive power source terminal 38*a*, and when non-illustrated motors thereof are driven, ball screws connected to the drive shafts of the motors undergo rotation, and by displacement of the ball nuts that are screwed onto the ball screws, the tables 170*a* and 170*b*, which are connected to the ball nuts, are displaced. The movement directions and the amount of movement of the tables 170*a* and 170*b* are detected by non-illustrated detection devices (sensors), information thereof is supplied from the position information input terminal 38*b* to the circuit boards 22 of the first controller unit 20 and the second controller unit 60, and electrical processing is performed. As a result, the operating states of the electric actuators 110*a* and 110*b* can be grasped.

When the electric actuators 110*a* and 110*b* are energized in this manner, due to the electric power that is supplied while the electric actuators 110*a* and 110*b* are controlled by the first controller unit 20 and the second controller unit 60, heat is generated in the circuitry, etc., of the circuit boards 22. Such generated heat, for example, is released to the exterior through the heat dissipating unit 80 disposed in contact with the heat dissipating plate 28. More specifically, in the heat dissipating unit 80, heat is released via the large number of heat dissipating protrusions 92. In particular, since the heat dissipating protrusions 92 have trapezoidal shapes in cross section, the heat dissipation area is expanded, thus further enhancing the heat dissipating effect.

In the foregoing manner, according to the present embodiment, the heat dissipating units are disposed on the controller units that drive and control the electric actuators, and the heat dissipating units efficiently dissipate heat that is generated in the controllers themselves, to the exterior. In addition, since a large number of controller units can be disposed continuously without restricting the number of controller units, the controller assembly, which is superior in terms of the heat dissipating effect, can be obtained without requiring an increase in the size of the installation space.

Although a preferred embodiment of the present invention has been described in detail above, the controller assembly of the present invention is not limited to the present embodiment, and it goes without saying that various design modifications may be made to the embodiment without departing from the essential scope of the present invention as set forth in the appended claims.

For example, according to the present embodiment, the heat dissipating protrusions of the heat dissipating unit are formed with trapezoidal shapes in cross section. However, without concern to the trapezoidal shapes thereof, it goes without saying that, also in the case that the heat dissipating area is enlarged by constituting the heat dissipating protrusions in truncated conical shapes or other polygonal shapes, the same advantages and effects can be obtained.

What is claimed is:

1. A controller assembly comprising a plurality of controller units connected respectively to mating connectors, and a heat dissipating unit interposed between the controller units, wherein the heat dissipating unit comprises
   a plurality of heat dissipating protrusions configured to dissipate heat that is generated by heat generating sources of the controller units, to exterior, and
   the heat dissipating unit includes connectors configured to be connected electrically to respective connectors of the controller units.

2. The controller assembly according to claim 1, wherein the heat dissipating unit is attachable and detachable with respect to the controller units.

3. The controller assembly according to claim 1, wherein each of the controller units and the heat dissipating unit has a rectangular parallelepiped shape, a fitting projection is provided on one surface of each of the controller units and the heat dissipating unit, while a fitting recess is provided on another surface thereof, and the controller units and the heat dissipating unit are connected together by the fitting projection of each of the controller units being fitted into the fitting recess of the heat dissipating unit, and the fitting projection of the heat dissipating unit being fitted into the fitting recess of the controller units.

4. The controller assembly according to claim 3, wherein a dust-proof or drip-proof sealing member is provided around a periphery of the fitting projection of each of the controller units and the heat dissipating unit.

5. The controller assembly according to claim 3, wherein openings through which the connectors are exposed are disposed respectively on inner sides of the fitting projection and the fitting recess of each of the controller units and the heat dissipating unit.

6. The controller assembly according to claim 3, wherein one surface of each of the controller units comprises a heat dissipating plate, and another surface of the heat dissipating unit is placed m contact with the heat dissipating plate.

7. The controller assembly according to claim 6, wherein a heat dissipating sheet is provided on the other surface of the heat dissipating unit, and the heat dissipating sheet is placed in contact with the heat dissipating plate.

8. The controller assembly according to claim 7, wherein a recessed portion is provided on the other surface of the heat dissipating unit, and the heat dissipating sheet is disposed in the recessed portion.

* * * * *